(12) United States Patent
Briere

(10) Patent No.: US 8,659,030 B2
(45) Date of Patent: Feb. 25, 2014

(54) III-NITRIDE HETEROJUNCTION DEVICES HAVING A MULTILAYER SPACER

(75) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/397,190

(22) Filed: Feb. 15, 2012

(65) Prior Publication Data

US 2012/0217506 A1 Aug. 30, 2012

Related U.S. Application Data

(60) Provisional application No. 61/447,479, filed on Feb. 28, 2011.

(51) Int. Cl.
*H01L 29/778* (2006.01)
(52) U.S. Cl.
USPC .................................................. 257/76
(58) Field of Classification Search
USPC .................... 257/76, 194, E29.253
See application file for complete search history.

(56) References Cited

U.S. PATENT DOCUMENTS

| 6,849,882 | B2 | 2/2005 | Chavarkar | |
|---|---|---|---|---|
| 7,547,928 | B2 * | 6/2009 | Germain et al. | 257/194 |
| 8,193,562 | B2 * | 6/2012 | Suh et al. | 257/194 |
| 2006/0006414 | A1 * | 1/2006 | Germain et al. | 257/192 |
| 2009/0072272 | A1 * | 3/2009 | Suh et al. | 257/194 |
| 2009/0191674 | A1 * | 7/2009 | Germain et al. | 438/172 |
| 2010/0289029 | A1 * | 11/2010 | Ichimura et al. | 257/76 |

* cited by examiner

*Primary Examiner* — Thao P. Le
(74) *Attorney, Agent, or Firm* — Farjami & Farjami LLP

(57) ABSTRACT

In accordance with one implementation of the present disclosure, a III-Nitride heterojunction device includes a III-Nitride channel layer, a III-Nitride multilayer spacer situated over the III-Nitride channel layer, and a III-Nitride barrier layer situated over the III-Nitride multilayer spacer. A two-dimensional electron gas (2DEG) is formed near an interface of said III-Nitride Channel layer and said III-Nitride multilayer spacer. The III-Nitride multilayer spacer includes a III-Nitride interlayer. In one implementation, the III-Nitride multilayer spacer includes a III-Nitride polarization layer that is situated over the III-Nitride interlayer. The III-Nitride polarization layer has a higher total polarization than the III-Nitride interlayer, the III-Nitride channel layer, and the III-Nitride barrier layer.

30 Claims, 4 Drawing Sheets

III-NITRIDE HETEROJUNCTION DEVICES HAVING A MULTILAYER SPACER

RELATED APPLICATION

The present application claims the benefit of and priority to a pending provisional application entitled "III-Nitride Heterojunction Devices, HEMTs and Related Device Structures," Ser. No. 61/447,479 filed on Feb. 28, 2011. The disclosure in that pending provisional application is hereby incorporated fully by reference into the present application.

STATEMENT OF GOVERNMENT INTEREST

This invention was made with Government support under Contract No. DE-AR0000016 awarded by Advanced Research Projects Agency-Energy (ARPA-E). The Government has certain rights in this invention.

BACKGROUND

A III-Nitride device, such as a transistor, based on a III-Nitride heterojunction can typically exploit inherent piezoelectric and spontaneous polarization fields and subsequent generation of a two-dimensional electron gas (2DEG). For example, the inherent piezoelectric and spontaneous polarization fields and subsequent generation of the 2DEG can be exploited to form a high electron mobility transistor (HEMT).

In the III-Nitride device, as one example, an AlGaN barrier layer can be used to form an interface with a GaN channel layer. The 2DEG and high transconductance is formed near the interface of the GaN channel layer and the AlGaN barrier layer. To enhance mobility of the 2DEG, an AlN spacer layer can be formed between the GaN channel layer and the AlGaN barrier layer. Although the addition of the AlN spacer layer can be used to increase the piezoelectric charge at the interface with the GaN channel layer, it can have the deleterious effect of increasing the ohmic contact resistance of the III-Nitride device. Moreover, the addition of an AlN spacer layer may lead to poor morphological epitaxial growth, crystalline defect generation of any subsequent III-Nitride growth, including the AlGaN barrier layer, due to the increased mismatch in lattice constants caused by the higher Al content in the AlN spacer layer, and may even lead to undesirable warp, bow or ultimately cracking of the III-Nitride material and wafer.

SUMMARY

The present disclosure is directed to III-Nitride heterojunction devices having a multilayer spacer, substantially as shown in and/or described in connection with at least one of the figures, and as set forth more completely in the claims.

DETAILED DESCRIPTION

Figure 1:
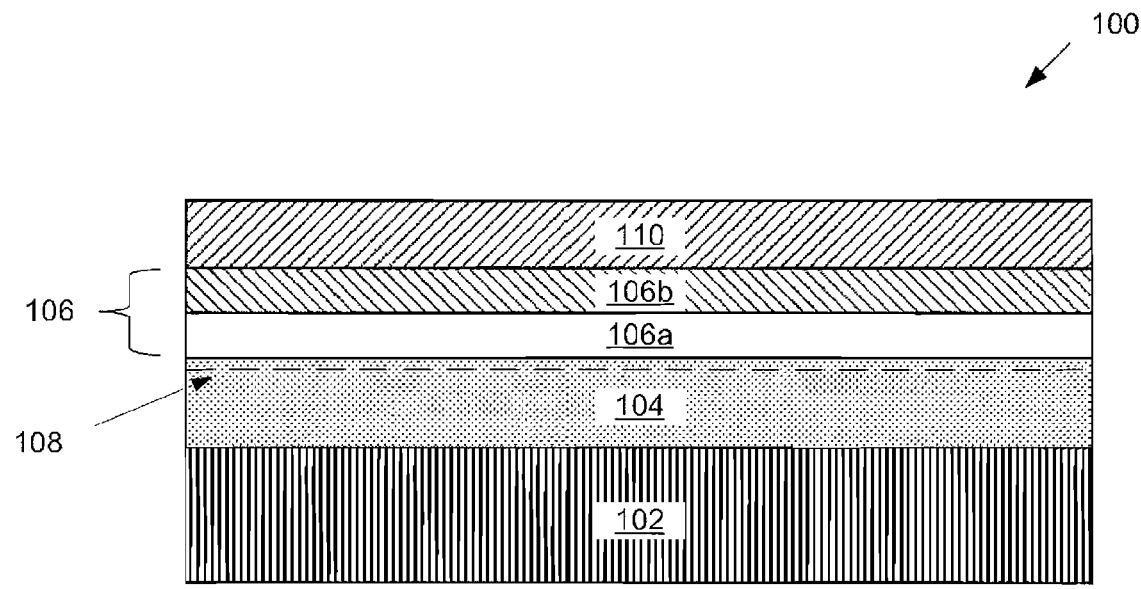
FIG. 1 presents an exemplary diagram including a cross section of a structure according to an implementation disclosed in the present application.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As used herein, "III-Nitride" refers to a compound semiconductor that includes nitrogen and at least one group three element including Al, Ga, In and B, and including but not limited to any of its alloys, such as aluminum gallium nitride ($Al_xGa_{(1-x)}N$), indium gallium nitride ($In_yGa_{(1-y)}N$), aluminum indium nitride ($Al_xIn_{(1-x)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), amongst others. III-Nitride also refers generally to any polarity including but not limited to Ga-polar, N-polar, semi-polar and non-polar crystal orientations. III-Nitride also includes Wurtzitic, Zincblende and mixed polytypes, and includes single-crystal, monocrystal, polycrystal and amorphous crystal structures.

While materials such as GaN, AlN and AlGaN are specifically referenced in this application, different materials can be used such that a heterojunction interface between the materials can form a conductive channel including 2DEG. Furthermore, while III-Nitride materials are described, it will be appreciated that additional material can be included in a device without departing from the scope of the present disclosure.

When a layer is referred to as being "on," "over" or "overlying" another layer or substrate, it can be directly on the layer or substrate, or an intervening layer also can be present. A layer that is "directly on" another layer or substrate means that no intervening layer is present. It should also be understood that when a layer is referred to as being "on," "over" or "overlying" another layer or substrate, it can cover the entire layer or substrate, or a portion of the layer or substrate.

FIG. 1 illustrates structure 100 according to one implementation of the disclosure. In the illustrative implementation, structure 100 includes III-Nitride layer 102, III-Nitride channel layer 104, III-Nitride multi layer spacer 106 situated over III-Nitride channel layer 104, and III-Nitride barrier layer 110 situated over III-Nitride multilayer spacer 106.

III-Nitride layer 102 can include a III-Nitride buffer layer such as GaN, AlGaN or AlInN. In some implementations, III-Nitride layer 102 includes $Al_xGa_{(1-x)}N$ where x<0.15. In various implementations, III-Nitride layer 102 is intentionally doped, unintentionally doped or undoped. In certain implementations, III-Nitride layer 102 is undoped and exhibits a low carbon concentration of less than 5E17/cm3. In some implementations, III-Nitride layer 102 is more than approximately 1 micron thick, in other implementations, III-Nitride layer 102 is approximately 0.5 to approximately 1.0 microns thick, and in yet other implementations, III-Nitride layer 102 is approximately 0.1 to approximately 0.5 microns thick. Furthermore, III-Nitride layer 102 can include several layers, or can overlay one or a combination of other layers including III-Nitride layers of constant composition, graded transition layers, superlattice layers, nucleation layers, amorphous layers, metallic layers, organic layers or other interlayers, and substrates including but not limited to Group 4 substrates (e.g. Si, SiC, Ge), Group III-V substrates (e.g., III-N materials, III-As materials) and Sapphire.

In structure 100, III-Nitride channel layer 104 is situated on III-Nitride layer 102. In some implementations, III-Nitride channel layer 104 includes $(Al_xIn_yGa_{(1-x-y)}N)$. In certain implementations, III-Nitride channel layer 104 includes GaN. III-Nitride channel layer 104 can be, for example, approximately 0.1 to approximately 0.5 microns thick. In some implementations, III-Nitride channel layer 104 is approximately 0.2 to approximately 0.3 microns thick. In various implementations, III-Nitride channel layer 104 can be intentionally doped, unintentionally doped or undoped.

Also in structure 100, III-Nitride multilayer spacer 106 is situated on III-Nitride channel layer 104. III-Nitride multilayer spacer 106 can include a single layer or multiple layers of, for example, AlGaInN. The alloy composition of the layer or layers of III-Nitride multilayer spacer 106 in combination with III-Nitride barrier layer 110 and their thicknesses are formed so that III-Nitride multilayer spacer 106 and III-Nitride barrier layer 110 have different in-plane lattice constants than III-Nitride channel layer 104. As a result, a net polarization forms at an interface with III-Nitride channel layer 104 and a conductive channel having 2DEG 108 forms near an interface of III-Nitride channel layer 104 and III-Nitride multilayer spacer 106. 2DEG 108 is formed near the surface of III-Nitride channel layer 104 and III-Nitride multilayer spacer 106 enhances mobility and carrier confinement of 2DEG 108.

III-Nitride multilayer spacer 106 can have a larger in-plane lattice constant than III-Nitride channel layer 104. III-Nitride barrier layer 110 can also have a larger in-plane lattice constant than III-Nitride channel layer 104. However in various implementations, III-Nitride multilayer spacer 106 has a larger in-plane lattice constant than III-Nitride barrier layer 110. In some implementations, III-Nitride barrier layer 110 includes AlGaN, and in certain implementations, III-Nitride barrier layer 110 includes $Al_wGa_{(1-w)}N$ where w<0.35. In other implementations, III-Nitride barrier layer 110 includes $Al_wGa_{(1-w)}N$ where 0.10<w<0.30. III-Nitride barrier layer 110 is approximately 8 to approximately 35 nanometers thick and, in some implementations is approximately 15 to approximately 25 nanometers microns thick. However, a preferred thickness of III-Nitride barrier layer 110 may be dependent upon a composition of III-Nitride channel layer 104 and on a composition and thickness of layers within III-Nitride multilayer spacer 106. III-Nitride barrier layer 110 is thick enough to develop 2DEG 108 near an interface of III-Nitride channel layer 104 and III-Nitride multilayer spacer 106.

FIG. 1 shows an implementation where III-Nitride multilayer spacer 106 includes III-Nitride interlayer 106a and III-Nitride polarization layer 106b. Although a presence of III-Nitride barrier layer 110 is enough to form 2DEG 108, an addition of both III-Nitride polarization layer 106b and III-Nitride interlayer 106a enhances effective electron (carrier) mobility and carrier confinement of 2DEG 108. III-Nitride multilayer spacer 106 includes III-Nitride interlayer 106a that reduces lattice mismatch between III-Nitride multilayer spacer 106 and III-Nitride channel layer 104. More particularly, III-Nitride interlayer 106a reduces lattice mismatch between III-Nitride polarization layer 106b and III-Nitride channel layer 104. Thus, III-Nitride interlayer 106a may act as a stress relief layer for formation of III-Nitride polarization layer 106b as well as other subsequent layers formed over III-Nitride polarization layer 106b. Additionally the incorporation of III-Nitride interlayer 106a formed under III-Nitride polarization layer 106b and above III-Nitride channel layer 104 can potentially reduce charge trapping that may accumulate near III-Nitride polarization layer 106b more so than in device designs that do not incorporate III-Nitride interlayer 106a.

As shown in FIG. 1, III-Nitride polarization layer 106b is situated over III-Nitride interlayer 106a, which is situated directly on III-Nitride channel layer 104. In preferred implementations, 2DEG 108 is near the surface of III-Nitride channel layer 1.04 at a heterojunction with III-Nitride interlayer 106a. However, III-Nitride channel layer 104 does not form a uniform or continuous heterojunction or interface with III-Nitride polarization layer 106b because of formation of III-Nitride interlayer 106a, formed under III-Nitride polarization layer 106b and formed over III-Nitride channel layer 104.

III-Nitride interlayer 106a is less than approximately 1 nanometer thick. In some implementations, III-Nitride interlayer 106a is less than approximately 0.4 nanometers thick, and in some implementations, III-Nitride interlayer 106a is less than approximately 0.2 nanometers thick. Furthermore, in certain implementation, III-Nitride interlayer 106a is discontinuous.

In various implementations, III-Nitride interlayer 106a is substantially AlGaN. Also, in various implementations, III-Nitride polarization layer 106b is substantially AlN. Furthermore, in various implementations, III-Nitride channel layer 104 is substantially GaN. In one exemplary implementation, III-Nitride channel layer 104 includes GaN, III-Nitride polarization layer 106b includes thin AlN and III-Nitride interlayer 106a includes AlGaN. In certain implementations, III-Nitride interlayer 106a includes $Al_yGa_{(1-y)}N$ where y<0.5. III-Nitride interlayer 106a has a lower total polarization than III-Nitride polarization layer 106b and a higher total polarization than III-Nitride channel layer 104.

FIG. 1 shows that III-Nitride polarization layer 106b is situated on III-Nitride interlayer 106a. In certain implementations, III-Nitride polarization layer 106b is situated directly on III-Nitride interlayer 106a. III-Nitride polarization layer 106b is less than approximately 2 nanometers thick. In some implementations, III-Nitride polarization layer 106b is less than approximately 1 nanometer thick, and in some implementations, III-Nitride polarization layer 106b is less than approximately 0.5 nanometers thick. In some implementations, III-Nitride polarization layer 106b is discontinuous. In certain implementations, a thickness ratio of III-Nitride interlayer 106a to III-Nitride polarization layer 106b is between 5:1 and 1:1. In some implementations, the ratio is 3:1.

III-Nitride polarization layer 106b can be a III-Nitride material and can include AlGaN. III-Nitride polarization layer 106b has a higher total polarization than III-Nitride interlayer 106a, III-Nitride channel layer 104 and generally any layer situated between III-Nitride polarization layer 106b and III-Nitride channel layer 104. In certain implementations, III-Nitride polarization layer 106b includes $Al_zGa_{(1-z)}N$ where z>0.5, and in some implementations, III-Nitride polarization layer 106b includes substantially AlN. Additionally, in certain implementations the in-plane lattice constant of III-Nitride polarization layer 106b is larger than the in-plane lattice constant of III-Nitride barrier layer 110. Therefore where III-Nitride polarization layer 106b includes $Al_zGa_{(1-z)}N$ where z>0.5, III-Nitride barrier layer 110 includes $Al_xGa_{(1-x)}N$ where z>x.

In other implementations of the present disclosure, III-Nitride barrier layer 110 includes aluminum indium nitride ($Al_xIn_{(1-x)}N$). As such, both the in-plane lattice constant and total polarization of III-Nitride polarization layer 106b can be greater than the in-plane lattice constant and total polarization of both III-Nitride barrier layer 110 and III-Nitride channel layer 104. In certain implementations, the in-plane lattice constant of III-Nitride barrier layer 110 is substantially the same as the in-plane lattice constant of III-Nitride channel layer 104.

Figure 2:
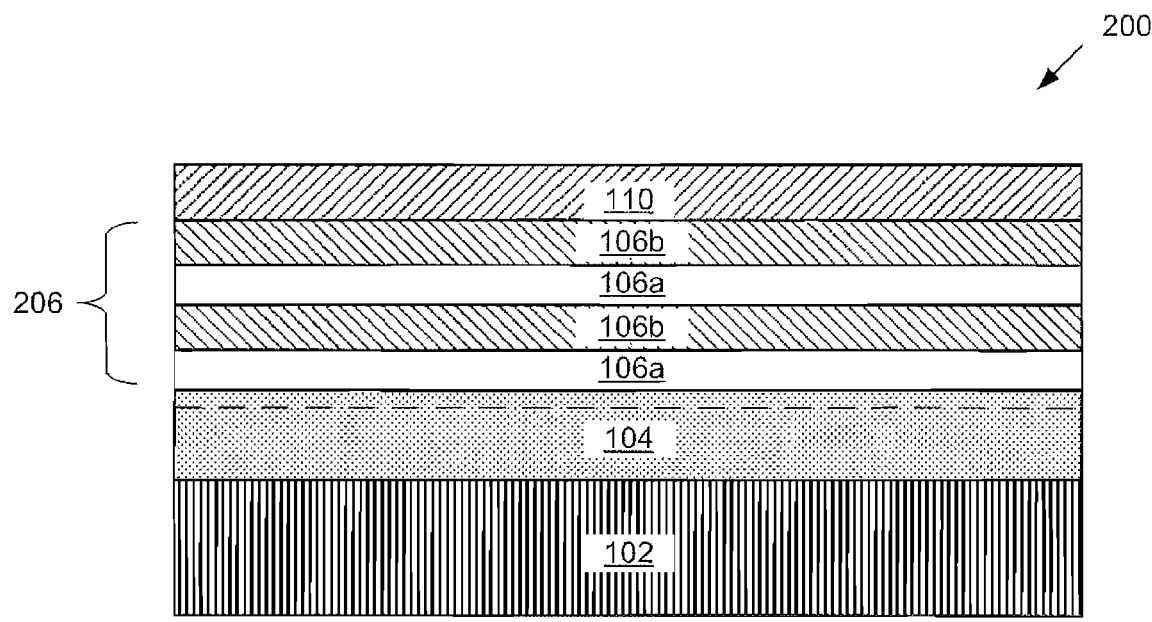
FIG. 2 presents an exemplary diagram including a cross section of a structure according to an implementation disclosed in the present application.

While in the present implementation III-Nitride multilayer spacer 106 includes III-Nitride interlayer 106a and III-Nitride polarization layer 106b, other implementations include a III-Nitride multilayer spacer includes additional layers that are similar to or the same as III-Nitride interlayer 106a and III-Nitride polarization layer 106b, and can also include other interlayers. In some implementations, III-Nitride multilayer spacer 106 includes at least two of III-Nitride interlayer 106a. Also, in some implementations, III-Nitride multilayer spacer 106 includes at least two of III-Nitride polarization layer 106b. As shown in FIG. 2, for example, structure 200 includes III-Nitride multilayer spacer 206 having a repeated addition of III-Nitride interlayer 106a and III-Nitride polarization layer 106b, which results in III-Nitride multilayer spacer 206 having four-layers.

Additional layers similar to or the same as III-Nitride interlayer 106a and III-Nitride polarization layer 106b can also be used to further modify III-Nitride multilayer spacer 206 beyond having two of each layer. III-Nitride multilayer spacer 206 can have an odd or even number of total layers. Also, a thicknesses of III-Nitride interlayer 106a and III-Nitride polarization layer 106b and repeated periodic alternation of those and/or other layers may result in formation of, for example, a superlattice structure (SLS), a multiple quantum well (MQW) structure or a multiple layer structure region. An advantage of a SLS is creation of discrete energy levels associated with the SLS which are different from discrete energy levels associated with III-Nitride interlayer 106a or III-Nitride polarization layer 106b, and can be used to tailor a III-Nitride multilayer spacer to achieve a specific bandgap and effective polarization.

Figure 3:
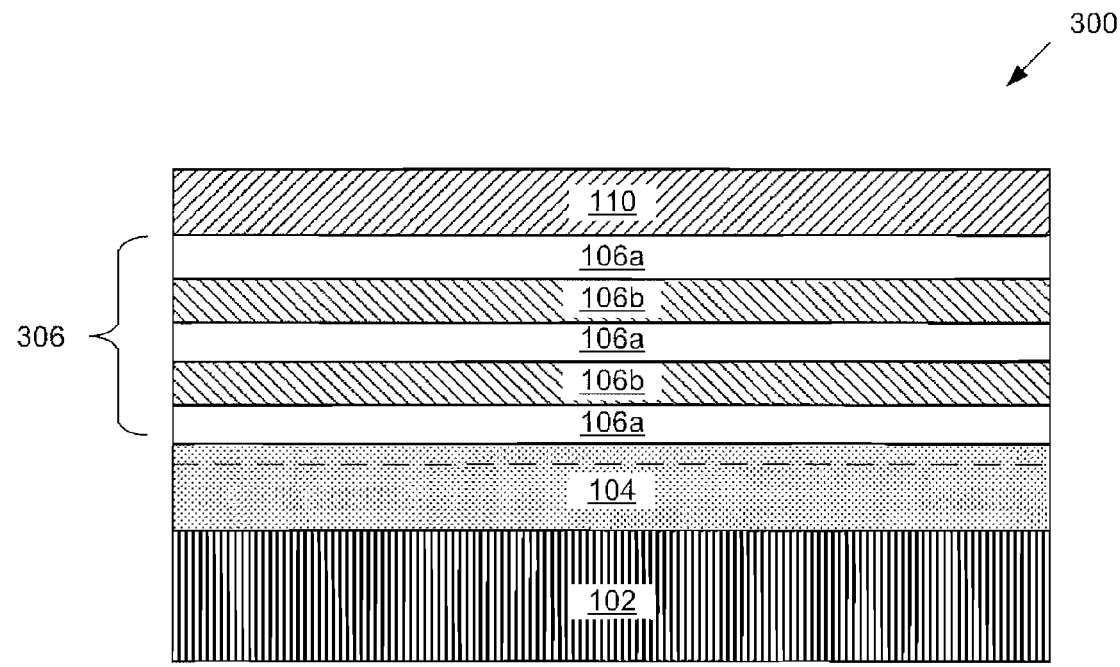
FIG. 3 presents an exemplary diagram including a cross section of a structure according to an implementation disclosed in the present application.

Either III-Nitride interlayer 106a or III-Nitride polarization layer 106b (or another interlayer) may terminate a top of a III-Nitride multilayer spacer. For example, structure 300 in FIG. 3 includes III-Nitride multilayer spacer 306 corresponding to III-Nitride multilayer spacer 106 in FIG. 1. In III-Nitride multilayer spacer 306, III-Nitride interlayer 106a is repeated three times, while III-Nitride polarization layer 106b is only repeated twice, such that a top of III-Nitride multilayer spacer 306 is terminated with III-Nitride interlayer 106a.

Figure 4:
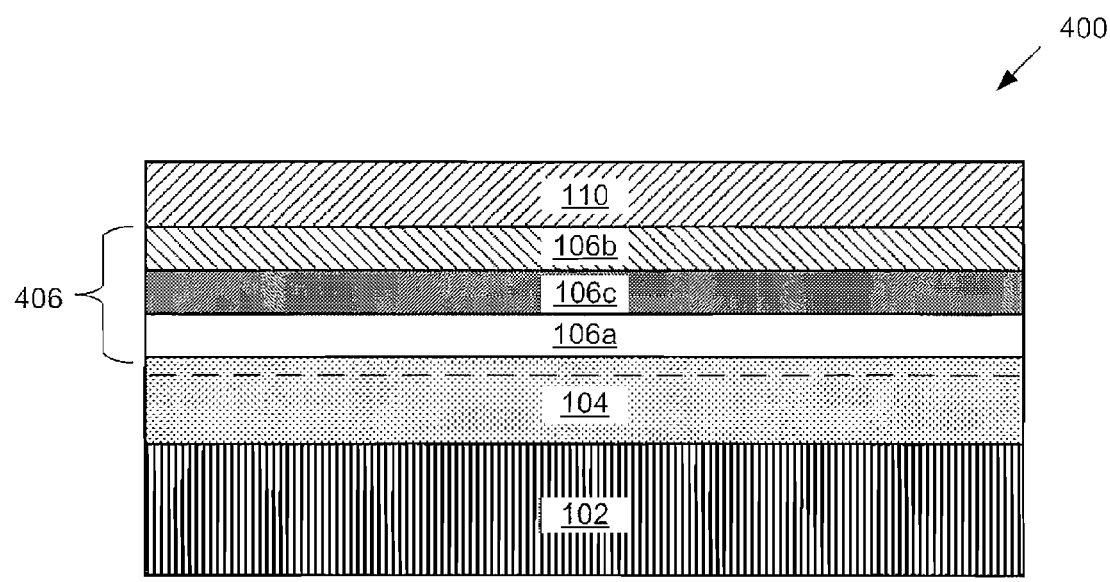
FIG. 4 presents an exemplary diagram including a cross section of a structure according to an implementation disclosed in the present application.

A III-Nitride multilayer spacer can also include III-Nitride interlayer 106c, as demonstrated by FIG. 4. Referring to FIG. 4, structure 400 includes III-Nitride multilayer spacer 406 having III-Nitride interlayer 106c. III-Nitride interlayer 106c can include $Al_vGa_{(1-v)}N$ and can be doped or undoped. In some implementations, III-Nitride interlayer 106c includes $Al_yGa_{(1-y)}N$ but is doped differently than III-Nitride interlayer 106a. III-Nitride interlayer 106c has a lower total polarization than III-Nitride polarization layer 106b. In the present implementation, III-Nitride interlayer 106c is situated between III-Nitride interlayer 106a and III-Nitride polarization layer 106b.

Figure 5:
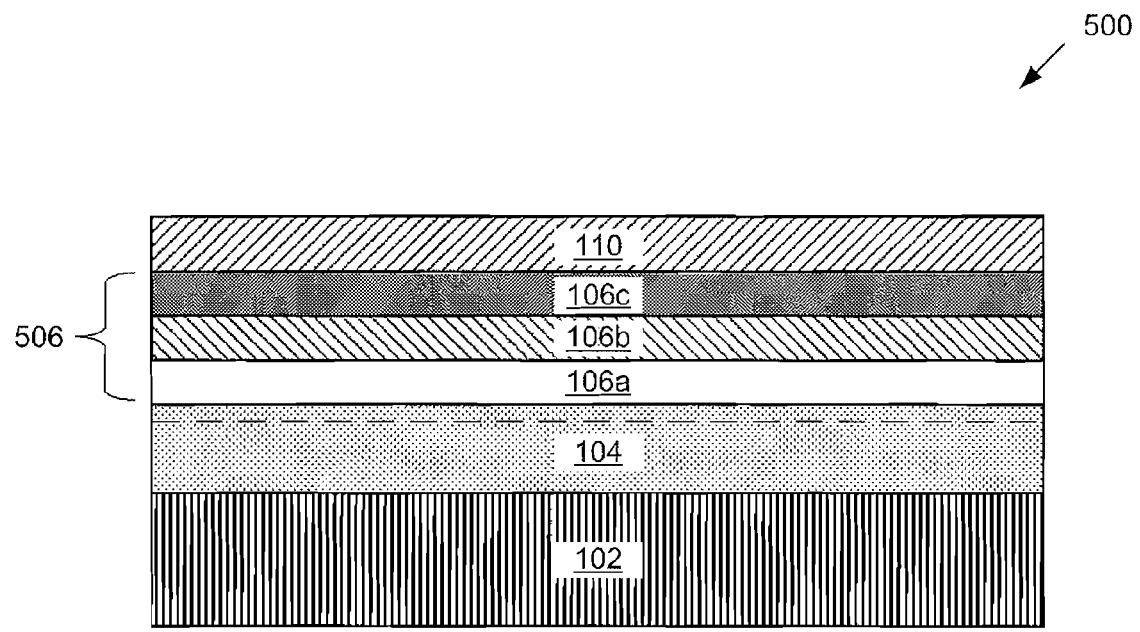
FIG. 5 presents an exemplary diagram including a cross section of a structure according to an implementation disclosed in the present application.

In a III-Nitride multilayer spacer, III-Nitride polarization layer 106b can also be situated between III-Nitride interlayer 106a and III-Nitride interlayer 106c. For example, referring to FIG. 5, structure 500 includes III-Nitride multilayer spacer 506. As shown in FIG. 5, in certain implementations, III-Nitride polarization layer 106b is situated between III-Nitride interlayer 106a and III-Nitride interlayer 106c. Although not shown in the Figures, in some implementations, III-Nitride interlayer 106c is situated directly on III-Nitride channel layer 104.

Figure 6:
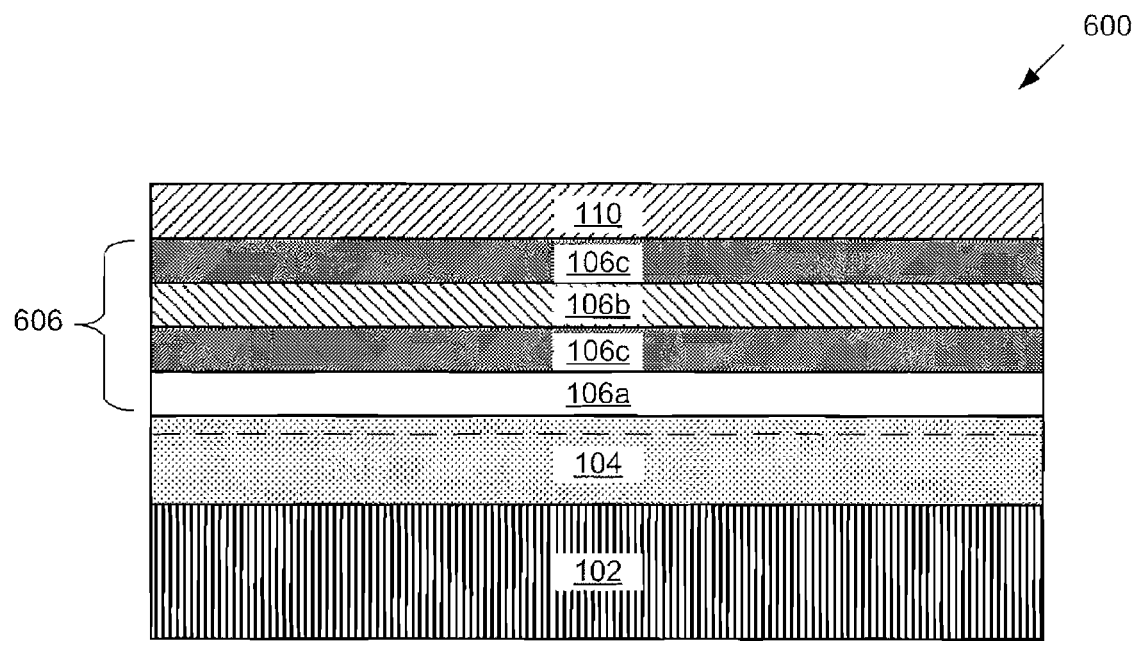
FIG. 6 presents an exemplary diagram including a cross section of a structure according to an implementation disclosed in the present application.

In some implementations, all or a combination of some of III-Nitride interlayer 106a, III-Nitride polarization layer 106b and III-Nitride interlayer 106c are repeated in a periodic alternation to form a SLS, a MQW or a modified III-Nitride multilayer spacer. For example, referring to FIG. 6, structure 600 includes III-Nitride multilayer spacer 606. As shown in FIG. 6, a combination of some of III-Nitride interlayer 106a, III-Nitride polarization layer 106b and III-Nitride interlayer 106c are repeated in a periodic alternation.

Figure 7:
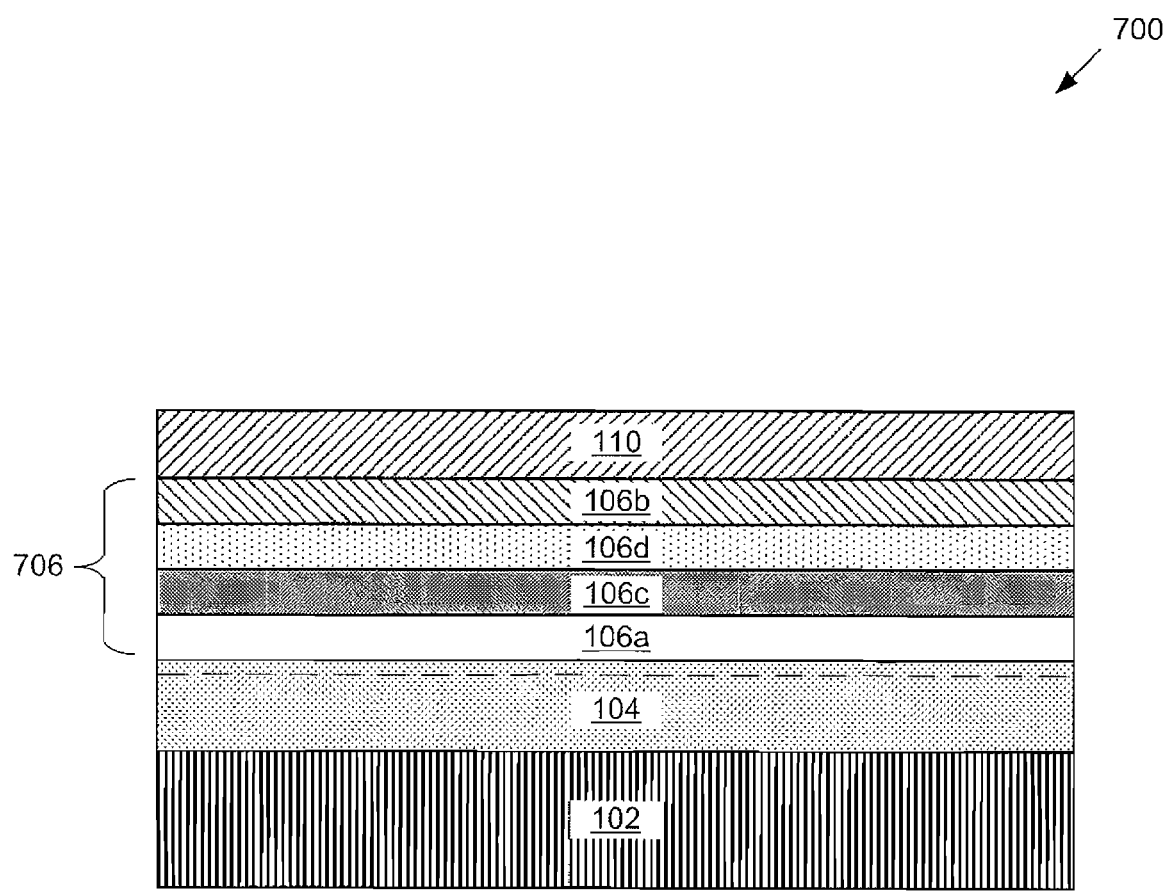
FIG. 7 presents an exemplary diagram including a cross section of a structure according to an implementation disclosed in the present application.

A III-Nitride multilayer spacer can also include III-Nitride interlayer 106d, as demonstrated by FIG. 7. Referring to FIG. 7, structure 700 includes III-Nitride multilayer spacer 706 having III-Nitride interlayer 106d, which can include $Al_uGa_{(1-u)}N$ and can be doped or undoped. In various implementations, III-Nitride interlayer 106d includes $Al_vGa_{(1-v)}N$ or $Al_yGa_{(1-y)}N$ but is doped differently than either III-Nitride interlayer 106a or III-Nitride interlayer 106c. III-Nitride interlayer 106d has a lower total polarization than III-Nitride polarization layer 106b. In certain implementations, not shown in the Figures, III-Nitride interlayer 106d is situated directly on III-Nitride channel layer 104. In other implementations, all or only some of III-Nitride interlayer 106a, III-Nitride polarization layer 106b, III-Nitride interlayer 106c and III-Nitride interlayer 106d are repeated in periodic alteration of those layers and/or other layers to form any combination of a SLS, a MQW or a multilayer structure to result in other exemplary structures not shown in the Figures.

In other implementations, other III-Nitride interlayers can be added to modify a III-Nitride multilayer spacer. In various implementations, III-Nitride polarization layer 106b includes $Al_zGa_{(1-z)}N$ and has a highest polarization of all layers in a III-Nitride multilayer spacer. Furthermore, III-Nitride polarization layer 106b should generally not be situated directly on III-Nitride channel layer 104.

In accordance with various implementations, structures described with respect to FIGS. 1-7 can be used as semiconductor material stacks supporting fabrication of III-Nitride based field-effect transistors (FETs) and more particularly high electron mobility transistors (HEMTs). As such, additional layers may be on or above III-Nitride barrier layer 110 which depend on the type of HEMT device being designed. These additional layers include, but are not limited to, additional III-Nitride capping layers, insulating and/or dielectric layers, metal layers and various organic material layers. These additional layers may result in formation of III-Nitride based HEMTs which include metal-insulator-semiconductor FETs (MISFETs), metal-oxide-semiconductor FETs (MOSFETs), and Schottky gated HEMTs, and may be either depletion mode or enhancement mode devices, all comprising III-Nitride multilayer spacer 106 including at least III-Nitride polarization layer 106b and III-Nitride interlayer 106a, formed between III-Nitride barrier layer 110 and III-Nitride channel layer 104. In depletion mode devices, 2DEG 108 formed near the interface of III-Nitride channel layer 104 and III-Nitride multilayer spacer 106 is not interrupted. In enhancement mode devices, 2DEG 108 formed near the interface of III-Nitride channel layer 104 and III-Nitride multilayer spacer 106 is interrupted.

Thus, as described above, structures in accordance with various implementations of the disclosure, can include, among other things a III-Nitride multilayer spacer between a III-Nitride barrier layer and a III-Nitride channel layer. The III-Nitride multilayer spacer can include a III-Nitride polarization layer and a III-Nitride interlayer that is underlying the III-Nitride polarization layer. The III-Nitride polarization layer combined with the underlying III-Nitride interlayer can provide enhanced 2DEG formation in the III-Nitride channel layer. Furthermore, the III-Nitride polarization layer combined with the underlying III-Nitride interlayer can lower contact resistance to the III-Nitride channel layer, amongst other advantages. Moreover, utilization of the III-Nitride multilayer spacer according to various implementation disclosed herein, results in enhanced morphological epitaxial growth, reduces crystalline defect generation of any subsequent III-Nitride growth, including an AlGaN barrier layer, due to reduced mismatch in lattice constants, and results in reduction of undesirable warp, bow, and increases reliability and mechanical integrity and stability of the III-Nitride material and wafer. As such, structures implementing the III-Nitride multilayer spacer as disclosed in the present application can have improved performance.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A III-Nitride heterojunction device comprising:
a III-Nitride channel layer, a III-Nitride multilayer spacer situated over said III-Nitride channel layer, and a III-Nitride barrier layer situated over said III-Nitride multilayer spacer; and
a two-dimensional electron gas (2DEG) formed near an interface of said III-Nitride channel layer and said III-Nitride multilayer spacer, said III-nitride barrier layer contributing to formation of said 2DEG;
said III-Nitride multilayer spacer comprising a III-Nitride interlayer.

2. The III-Nitride heterojunction device of claim 1, wherein said III-Nitride interlayer reduces lattice mismatch between said III-Nitride multilayer space and said III-Nitride channel layer.

3. The III-Nitride heterojunction device of claim 1, wherein said III-Nitride multilayer spacer includes a III-Nitride polarization layer.

4. The III-Nitride heterojunction device of claim 1, wherein said III-Nitride multilayer spacer comprises a III-Nitride polarization layer that is situated over said III-Nitride interlayer.

5. The III-Nitride heterojunction device of claim 4, wherein said III-Nitride polarization layer has a higher total polarization than said III-Nitride interlayer and said III-Nitride channel layer.

6. The III-Nitride heterojunction device of claim 4, wherein said III-Nitride polarization layer has a higher total polarization than any layer between said III-Nitride polarization layer and said III-Nitride channel layer.

7. The III-Nitride heterojunction device of claim 4, wherein said III-Nitride polarization layer has a larger in-plane lattice constant than said III-Nitride channel layer.

8. The III-Nitride heterojunction device of claim 4, wherein said III-Nitride polarization layer has a larger in-plane lattice constant than said III-Nitride barrier layer.

9. The III-Nitride heterojunction device of claim 4, wherein said III-Nitride polarization layer comprises $Al_zGa_{(1-z)}N$ where $z>0.5$.

10. The III-Nitride heterojunction device of claim 9, wherein said III-Nitride barrier layer comprises $Al_xGa_{(1-x)}N$ where $z>x$.

11. The III-Nitride heterojunction device of claim 9, wherein said III-Nitride barrier layer comprises $Al_xIn_{(1-x)}N$.

12. The III-Nitride heterojunction device of claim 11, wherein the lattice constant of said III-Nitride barrier layer is substantially the same as the lattice constant of said III-Nitride channel layer.

13. The III-Nitride heterojunction device of claim 4, wherein said III-Nitride polarization layer is substantially AlN.

14. The III-Nitride heterojunction device of claim 1, wherein said 2DEG formed near said interface of said III-Nitride channel layer and said III-Nitride multilayer spacer is not interrupted.

15. The III-Nitride heterojunction device of claim 1, wherein said 2DEG formed near said interface of said III-Nitride channel layer and said III-Nitride multilayer spacer is interrupted.

16. The III-Nitride heterojunction device of claim 1, wherein said III-Nitride heterojunction device is selected from a group consisting of a MOSFET, a MISFET, or a Schottky gated PET.

17. A III-Nitride heterojunction device comprising:
a III-Nitride channel layer, a III-Nitride multilayer spacer situated over said III-Nitride channel layer, and a III-Nitride barrier layer situated over said III-Nitride multilayer spacer;
said III-Nitride multilayer spacer comprising a III-Nitride polarization layer that is situated over a III-Nitride interlayer; and
a two-dimensional electron gas (2DEG) formed near an interface of said III-Nitride channel layer and said III-Nitride interlayer, said III-nitride barrier layer contributing to formation of said 2DEG.

18. The III-Nitride heterojunction device of claim 17, wherein said III-Nitride interlayer reduces lattice mismatch between said III-Nitride polarization layer and said III-Nitride channel layer.

19. The III-Nitride heterojunction device of claim 17, wherein said III-Nitride interlayer is situated directly on said III-Nitride channel layer.

20. The III-Nitride heterojunction device of claim 19, wherein said III-Nitride barrier layer is situated directly on said III-Nitride polarization layer.

21. The III-Nitride heterojunction device of claim 19, wherein said III-Nitride barrier layer is situated directly on said III-Nitride polarization layer.

22. The III-Nitride heterojunction device of claim 19, wherein said III-Nitride barrier layer is situated directly on said III-Nitride polarization layer.

23. The III-Nitride heterojunction device of claim 19, wherein said III-Nitride barrier layer is situated directly on said III-Nitride polarization layer.

24. The III-Nitride heterojunction device of claim 19, wherein said III-Nitride barrier layer is situated directly on said Ill-Nitride polarization layer.

25. The III-Nitride heterojunction device of claim 19, wherein said III-Nitride barrier layer is situated directly on said III-Nitride polarization layer.

26. The HI-Nitride heterojunction device of claim 19, wherein said III-Nitride barrier layer is situated directly on said III-Nitride polarization layer.

27. The III-Nitride heterojunction device of claim 19, wherein said III-Nitride barrier layer is situated directly on said III-Nitride polarization layer.

28. The III-Nitride heterojunction device of claim 17, wherein said 2DEG formed near said interface of said III-Nitride channel layer and said III-Nitride multilayer spacer is not interrupted.

29. The III-Nitride heterojunction device of claim 17, wherein said 2DEG formed near said interface of said III-Nitride channel layer and said III-Nitride multilayer spacer is interrupted.

30. The III-Nitride heterojunction device of claim 17, wherein said III-Nitride heterojunction device is selected from a group consisting of a MOSFET, a MISFET, or a Schottky gated FET.

* * * * *